United States Patent [19]

Kaiwa

[11] Patent Number: 5,349,301
[45] Date of Patent: Sep. 20, 1994

[54] MULTIPLE AMPLIFIER SYSTEM FOR A CAR

[75] Inventor: Hiroshi Kaiwa, Yamagata, Japan

[73] Assignees: Pioneer Electronic Corporation, Tokyo; Tohoku Pioneer Electronic Corporation, Tendo, both of Japan

[21] Appl. No.: 149,272

[22] Filed: Nov. 9, 1993

[30] Foreign Application Priority Data

Nov. 10, 1992 [JP] Japan .................................. 4-324962

[51] Int. Cl.$^5$ .............................................. H03F 3/68
[52] U.S. Cl. ...................................... 330/126; 381/100
[58] Field of Search .......................... 330/126, 302, 306; 381/86, 99, 100, 120

[56] References Cited

U.S. PATENT DOCUMENTS 4,991,221 2/1991 Rush ................... 381/100 X

*Primary Examiner*—Steven Mottola
*Attorney, Agent, or Firm*—Nikaido, Marmelstein, Murray & Oram

[57] ABSTRACT

A multiple amplifier system comprises a sound source, a power source, an electronic crossover network for dividing an audio signal from the sound source into a plurality of frequency ranges. Each of the divided audio signal is amplified by an individual power amplifier and fed to a corresponding speaker. A superposing circuit is connected to the sound source and the power source for superposing the audio signal from the sound source and power from the power source. The superposed signal is applied to the electronic crossover network through a lead.

3 Claims, 5 Drawing Sheets

MULTIPLE AMPLIFIER SYSTEM FOR A CAR

BACKGROUND OF THE INVENTION

The present invention relates to a car sound system and more particularly to a multiple amplifier system thereof.

The trends in today's car sound system require a combination stereo rather than a component stereo in order to provide sophisticated systems with various functions. One of the features of the combination stereo is a multiple amplifier system wherein a plurality of loudspeakers each for different frequency range and respective power amplifiers are provided so as to realize improved sound quality and to expand the reproducible frequency range.

FIG. 5 shows a conventional multiple amplifier system having a sound source 1 such as a CD player and a cassette deck. The audio signal from the source 1 is applied to an electronic crossover network 2 for dividing the audio signal into high, middle and low frequency ranges. The divided audio signals are fed to power amplifiers 3, 4 and 5 and further to a tweeter 6, midrange speaker 7, and woofer 8 through lines 9, 10 and 11, respectively. The multiple amplifier system provides a clear sound image, and reduced intermodulation distortion due to the explicit division.

In general, the power amplifiers 3, 4 and 5 are disposed adjacent the sound source 1 and the speakers 6, 7 and 8 are positioned at various places of the car interior, distant from the amplifiers, for example disposed behind the rear seat. Hence a part of each of the lines 9, 10 and 11 between dotted vertical lines in FIG. 5 must be threaded through spaces between various members of the car body. Therefore, a tiresome operation requiring time is needed for wiring, especially when passing the lines through members having complicated structure, such as members around a door panel.

SUMMARY OF THE INVENTION

An object of the present invention is to provide a multiple amplifier car sound system where the number of lines between the sound source and the amplifiers is decreased, thereby enabling to simplify the wiring of the lines through the body of the car.

According to the present invention, there is provided a multiple amplifier system for a car having a sound source, a power source, an electronic crossover network for dividing an audio signal from the sound source into a plurality of frequency ranges, a plurality of power amplifiers for separately amplifying the divided audio signals, and a plurality of speakers each of which is connected to the corresponding power amplifier.

The system comprises a superposing circuit connected to the sound source and the power source for superposing the audio signal from the sound source and power from the power source, and lead means connecting an output of the superposing circuit to the electronic crossover network.

Other objects and features of this invention will become understood from the following description with reference to the accompanying drawings.

DETAILED DESCRIPTION OF THE PREFERRED EMBODIMENTS

Figure 1:
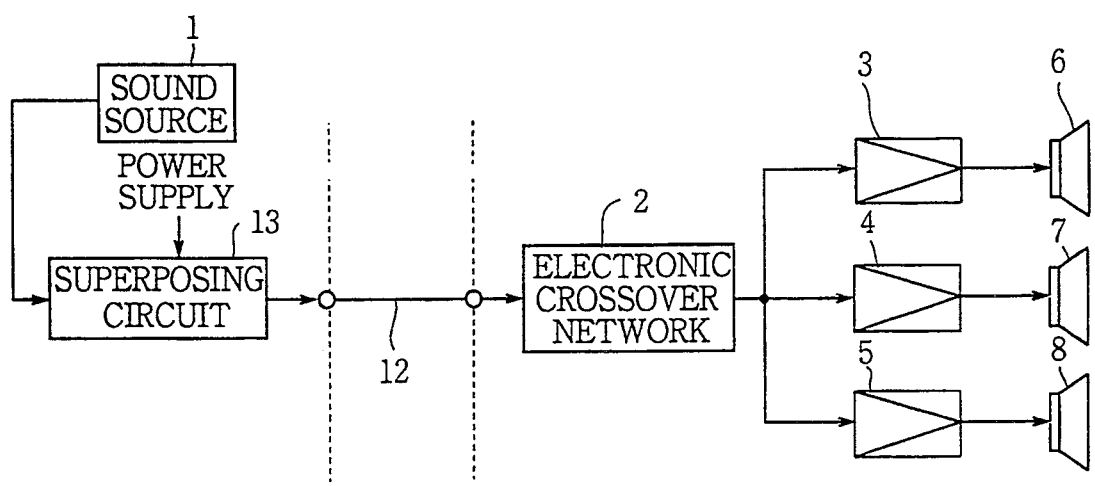
FIG. 1 is a schematic diagram conceptually showing a multiple amplifier system of the present invention.
Figure 5:
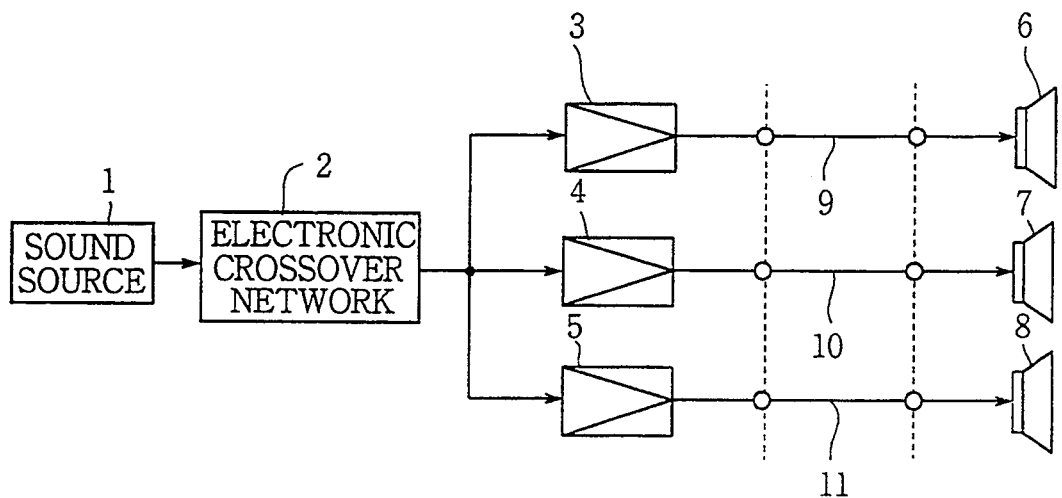
FIG. 5 is a schematic diagram showing a conventional multiple amplifier car sound system.

Referring to FIG. 1 wherein the same reference numerals as those in FIG. 5 designate the same parts to avoid repetitious explanation, an audio signal from the sound source 1 is fed to a power and audio signals superposing circuit 13 where a power supply signal from a power supply and the audio signal are superposed. The superposed signal is applied to the electronic crossover network 2 through a line 12 which extends through the body of the car. The audio signal of the superposed signal is divided into high, middle, and low frequency range signals by the crossover network 2. The audio signals are fed to the respective speakers, namely, the tweeter 6, midrange speaker 7 and the woofer 8, through the discrete power amplifiers 3, 4 and 5. The power and the audio signal are fed to the crossover network 2 through a single line, so that the wiring thereof is simplified.

Figure 2:
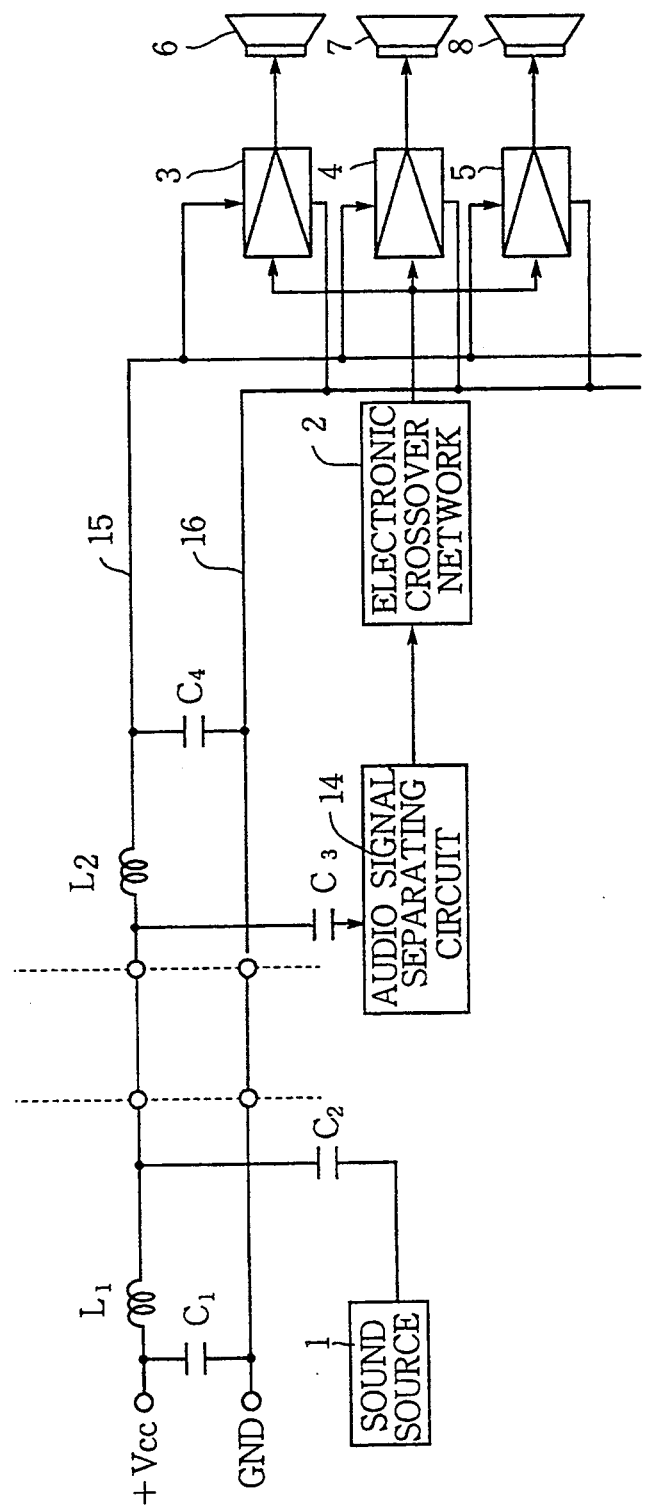
FIG. 2 is a diagram showing an embodiment of the multiple amplifier system of FIG. 1.

FIG. 2 shows an embodiment of the system conceptually shown in FIG. 1. The power and audio signals superposing circuit 13 shown in FIG. 1 comprises a capacitor input filter having a coil L1 serially provided on a power line 15, and a capacitor C1 provided between the power line 15 and a ground line 16. The circuit 13 further has a choke input filter having a coil L2 serially connected to the coil L1 and a capacitor C4 provided between the power line 15 and the ground line 16 in parallel to the capacitor C1. The filters are provided to eliminate the influence of variation in supply voltage Vcc during the driving of the car.

The sound source 1 is connected to the power line 15 at the output of the coil L1 through a capacitor C2. The power line 15 is further connected to an audio signal separating circuit 14 through a capacitor C3 at the input of the coil L2. The electronic crossover network 2 is connected to the audio signal separating section 14 thereby applying signals in respective frequency ranges to the power amplifiers 3, 4 and 5 and to the tweeter 6, midrange speaker 7 and woofer 8. The power line 15 and the ground line 16 are connected to the power amplifiers 3, 4 and 5 to amplify the audio signals. Thus, the audio signal is fed to the electronic crossover network 2 through the power line 15 together with the supply voltage Vcc.

When mounting the multiple amplifier system in a car, the sound source 1 is disposed at the front portion of the car such as in the dashboard. Meanwhile, the tweeter 6, midrange speaker 7 and the woofer 8, together with their respective power amplifiers 3 to 5, electronic crossover network 2 and the audio signal separating circuit 14 are disposed in the rear portion of the car. The lines 15 and 16 connected to the source 1 are passed between members around the door panels and other parts of the car toward the rear. Namely, the parts of the lines 15 and 16, indicated between the dotted vertical lines, are disposed in the narrow spaces of the body. Since the number of the lines which must be passed through the complicated parts of the car body is reduced, the wiring operation is simplified.

Figure 3:
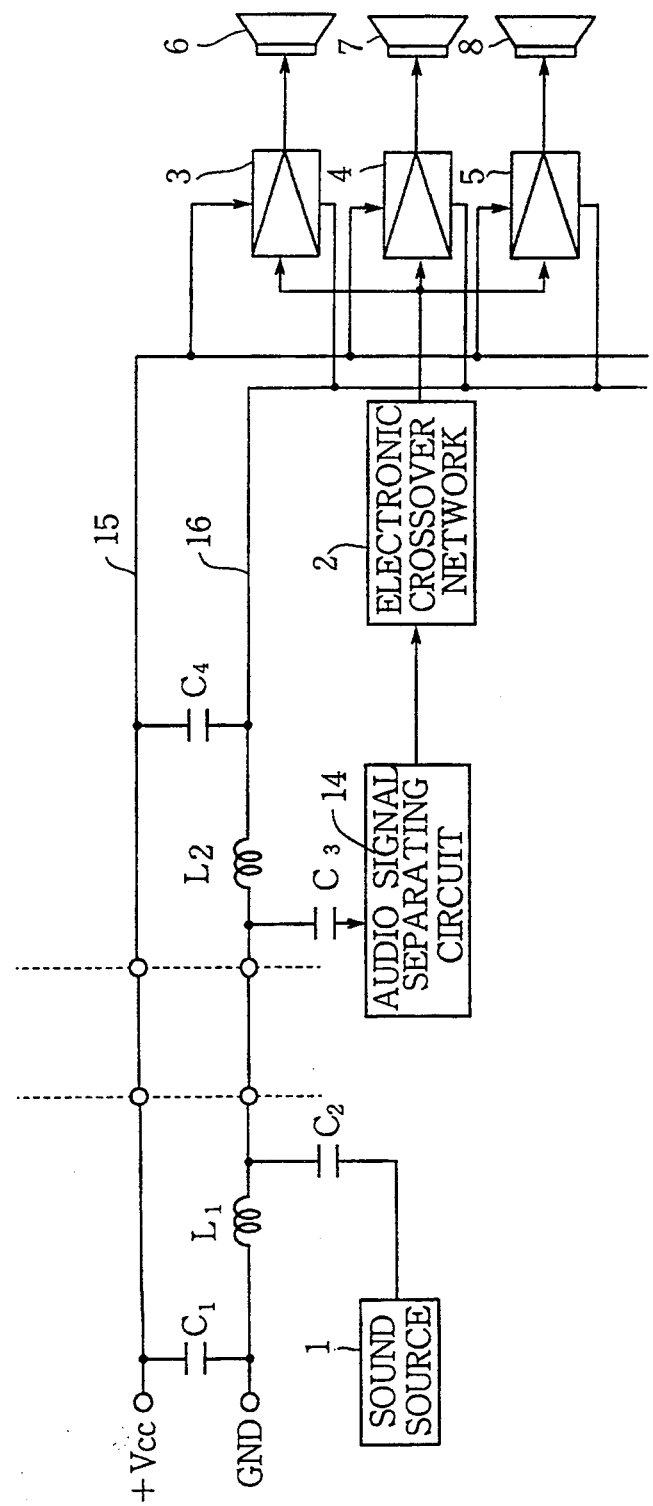
FIGS. 3 and 4 are diagrams showing modifications of the multiple amplifier system of FIG. 2.

FIG. 3 shows a modification of the multiple amplifier system. In the modification, the sound source 1 and the audio signal separating circuit 14 are connected to the ground line 16 through the capacitors C2 and C3, respectively. Namely, the audio signal is fed to the power amplifiers 3, 4 and 5 through the ground line 16. Other constructions and operations are the same as in the first embodiment.

Figure 4:
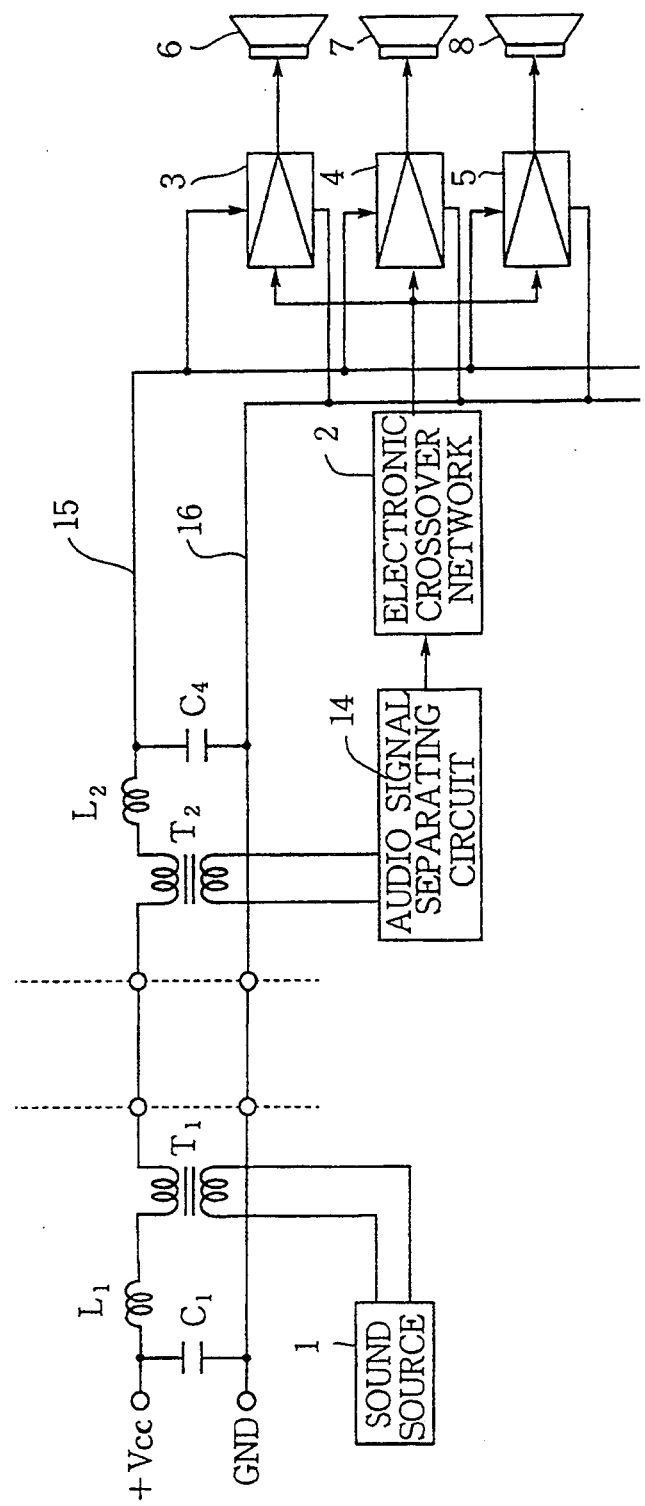

Referring to FIG. 4, the second modification of the embodiment uses transformers T1 and T2 with magnetic coils instead of connecting the source 1 and the audio signal separating circuit 14 through the capacitors. Accordingly, the voltage of the audio signal from the sound source is converted into another voltage by the transformer T1 so as to be superposed with the power supply signal from the power supply. The superposed signal is fed to the audio signal separating circuit 14 through the transformer T2, thereby reproducing the original audio signal.

The multiple amplifier system to which the present invention is applied may comprise a two-way speaker system having a tweeter and a mid to low range speaker, or a full-range speaker. When ambient noises are included in the retrieved audio signal, the present invention may be modified so that the audio signal is frequency-modulated, or digitally converted before superposing.

According to the present invention, the power amplifiers and the electronic crossover network are disposed adjacent the speakers so that it becomes possible to decrease the distance between the speakers and the amplifiers where many lines must be provided. Moreover, since the audio signal is superposed over a power supply signal fed to the amplifiers, only a single line is necessary between the sound source and the audio signal separating circuit 14. Hence, the wiring operation of the lines through complicated parts of the car body is facilitated.

While the presently preferred embodiments of the present invention have been shown and described, it is to be understood that these disclosures are for the purpose of illustration and that various changes and modifications may be made without departing from the scope of the invention as set forth in the appended claims.

What is claimed is:

1. A multiple amplifier system for a car having a sound source, a power source, an electronic crossover network for dividing an audio signal from the sound source into a plurality of frequency ranges, a plurality of power amplifiers for separately amplifying the divided audio signals, and a plurality of speakers each of which is connected to the corresponding power amplifier, the system comprising:

a superposing circuit connected to the sound source and the power source for superposing the audio signal from the sound source and power from the power source on an output; and lead means connecting the output of the superposing circuit to the electronic crossover network.

2. The system according to claim 1 wherein:

the lead means includes filters for eliminating fluctuation of the power.

3. The system according to claim 2 further comprising means connecting power output from the filters to the power amplifiers.

* * * * *